US011640987B2

(12) United States Patent
Waite

(10) Patent No.: US 11,640,987 B2
(45) Date of Patent: May 2, 2023

(54) IMPLANT TO FORM VERTICAL FETS WITH SELF-ALIGNED DRAIN SPACER AND JUNCTION

(71) Applicant: Applied Materials, Inc., Santa Clara, CA (US)

(72) Inventor: Andrew Michael Waite, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 17/167,892

(22) Filed: Feb. 4, 2021

(65) Prior Publication Data

US 2022/0246746 A1  Aug. 4, 2022

(51) Int. Cl.
*H01L 29/66* (2006.01)
*H01L 21/311* (2006.01)
*H01L 21/265* (2006.01)

(52) U.S. Cl.
CPC .. *H01L 29/66666* (2013.01); *H01L 21/26586* (2013.01); *H01L 21/31111* (2013.01)

(58) Field of Classification Search
CPC ......... H01L 29/66666; H01L 21/26586; H01L 21/31111; H01L 29/78642; H01L 29/7827
See application file for complete search history.

(56) References Cited

U.S. PATENT DOCUMENTS

| | | | |
|---|---|---|---|
| 6,632,712 B1* | 10/2003 | Ang | H01L 29/7827 438/269 |
| 8,158,468 B2* | 4/2012 | Masuoka | H01L 29/42392 257/329 |
| 8,476,132 B2* | 7/2013 | Masuoka | H01L 21/823885 438/269 |
| 9,450,078 B1* | 9/2016 | Tang | H01L 21/324 |
| 9,583,489 B1* | 2/2017 | Anderson | H01L 27/0921 |
| 9,773,901 B1* | 9/2017 | Gluschenkov | H01L 29/66666 |
| 9,780,208 B1* | 10/2017 | Xie | H01L 27/088 |
| 9,825,032 B1* | 11/2017 | Bentley | H01L 21/743 |
| 9,997,413 B1* | 6/2018 | Leobandung | H01L 27/092 |
| 10,026,658 B2* | 7/2018 | Tsai | H01L 21/3247 |
| 10,109,498 B2* | 10/2018 | Hautala | H01L 21/31155 |
| 10,256,320 B1* | 4/2019 | Liu | H01L 21/823814 |
| 10,504,794 B1* | 12/2019 | Lee | H01L 29/0847 |
| 10,522,658 B1* | 12/2019 | Cheng | H01L 21/823842 |
| 10,535,754 B2* | 1/2020 | Xu | H01L 29/78642 |
| 10,553,715 B2* | 2/2020 | Masuoka | H01L 29/66712 |

(Continued)

*Primary Examiner* — Bilkis Jahan
*Assistant Examiner* — Victor V Barzykin
(74) *Attorney, Agent, or Firm* — KDW Firm PLLC

(57) ABSTRACT

Disclosed herein are methods for forming vertical field-effect-transistor (vFET). In some embodiments, a method includes providing a device structure including a plurality of pillars extending from a base layer, forming a capping layer over the device structure, and forming a drain in an upper section of each of the plurality of pillars by performing an angled implant to each of the plurality of pillars. The angled implant may be delivered at a non-zero angle of inclination relative to a perpendicular extending from a top surface of the base layer. The method may further include etching the device structure to remove the capping layer from along a lower section of each of the plurality of pillars, wherein the capping layer remains along the upper section of each of the plurality of pillars.

18 Claims, 8 Drawing Sheets

(56) References Cited

U.S. PATENT DOCUMENTS

| | | | |
|---|---|---|---|
| 10,573,727 B2* | 2/2020 | Anderson | H01L 21/3085 |
| 10,707,329 B2* | 7/2020 | Li | H01L 21/823487 |
| 10,734,391 B2* | 8/2020 | Masuoka | H01L 21/2253 |
| 10,790,379 B1* | 9/2020 | Li | H01L 29/0657 |
| 10,896,912 B2* | 1/2021 | Reznicek | H01L 21/823885 |
| 10,964,603 B2* | 3/2021 | Yamashita | H01L 21/324 |
| 11,139,215 B2* | 10/2021 | Yamashita | H01L 27/092 |
| 11,164,787 B2* | 11/2021 | Reznicek | H01L 21/823418 |
| 11,205,593 B2* | 12/2021 | Sung | H01L 21/3083 |
| 11,295,986 B2* | 4/2022 | Kim | H01L 21/823412 |
| 2008/0173936 A1* | 7/2008 | Yoon | H01L 29/0847 257/E27.06 |
| 2010/0210079 A1* | 8/2010 | Masuoka | H01L 29/78642 438/156 |
| 2010/0213539 A1* | 8/2010 | Masuoka | H01L 27/1203 257/329 |
| 2010/0219483 A1* | 9/2010 | Masuoka | H01L 27/0207 257/369 |
| 2011/0062523 A1* | 3/2011 | Masuoka | H01L 21/823885 257/E27.06 |
| 2014/0252459 A1* | 9/2014 | Yu | H01L 27/10873 438/270 |
| 2014/0353593 A1* | 12/2014 | Smets | H01L 29/0676 257/39 |
| 2015/0091081 A1* | 4/2015 | Suh | H01L 29/66666 257/329 |
| 2015/0137067 A1* | 5/2015 | Colinge | B82Y 40/00 438/268 |
| 2015/0333077 A1* | 11/2015 | Tsai | H01L 27/11521 257/319 |
| 2015/0364381 A1* | 12/2015 | Choi | H01L 29/45 438/268 |
| 2016/0379832 A1* | 12/2016 | Ruffell | H01L 29/6656 438/696 |
| 2018/0248018 A1* | 8/2018 | Park | H01L 29/78618 |
| 2018/0277446 A1* | 9/2018 | Gluschenkov | H01L 21/823814 |
| 2019/0252260 A1* | 8/2019 | Reznicek | H01L 21/823425 |
| 2019/0371920 A1* | 12/2019 | Xu | H01L 29/78684 |
| 2020/0058767 A1* | 2/2020 | Cheng | H01L 29/66545 |
| 2020/0066881 A1* | 2/2020 | Xu | H01L 29/42356 |
| 2020/0111714 A1* | 4/2020 | Lee | H01L 29/785 |
| 2020/0118890 A1* | 4/2020 | Bao | H01L 21/823885 |
| 2020/0161451 A1* | 5/2020 | Lee | H01L 29/0653 |
| 2020/0203355 A1* | 6/2020 | Wu | H01L 27/0207 |
| 2020/0251558 A1* | 8/2020 | Hashemi | H01L 29/42356 |
| 2020/0259000 A1* | 8/2020 | Mochizuki | H01L 29/6656 |
| 2020/0303388 A1* | 9/2020 | Reznicek | H01L 29/66666 |
| 2020/0303543 A1* | 9/2020 | Cheng | H01L 21/76834 |
| 2020/0328127 A1* | 10/2020 | Yamashita | H01L 21/3086 |
| 2020/0343241 A1* | 10/2020 | Wu | H01L 21/823487 |
| 2021/0098602 A1* | 4/2021 | Xie | H01L 29/66545 |
| 2021/0104440 A1* | 4/2021 | Miller | H01L 21/823481 |
| 2021/0151449 A1* | 5/2021 | Reznicek | H01L 21/28518 |
| 2021/0193527 A1* | 6/2021 | Reznicek | H01L 29/0847 |
| 2021/0366776 A1* | 11/2021 | Sung | H01L 21/31155 |
| 2022/0045196 A1* | 2/2022 | Mochizuki | H01L 29/6656 |
| 2022/0069106 A1* | 3/2022 | Li | H01L 29/0847 |

* cited by examiner

IMPLANT TO FORM VERTICAL FETS WITH SELF-ALIGNED DRAIN SPACER AND JUNCTION

FIELD OF THE DISCLOSURE

The present embodiments relate to semiconductor device patterning, and more particularly, to forming vertical field-effect transistors (FETs) with self-aligned drain spacers and junctions.

BACKGROUND OF THE DISCLOSURE

To satisfy the ever-increasing desire for a smaller footprint for semiconductor devices, designers have turned to vertical FETs (vFETs). VFETs generally have channels arranged perpendicular to the substrate surface, which is in contrast to conventional FETs having channels configured along a plane of the substrate surface. The vertical configuration of vFETs allows for increased packing density since vFETs provide improved scaling limits as compared to conventional FETs. However, conventional vFET patterning techniques require very precise alignment of contacts, gates, sources, drains, junctions, etc., which are susceptible to misalignment errors.

It therefore would be desirable to provide an integration scheme capable of self-aligning the drain junction of the vFET to the spacer or cap at the top of the vFET to improve device reliability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a plurality of pillars extending from a base layer, forming a capping layer over the device structure, and forming a drain in an upper section of each of the plurality of pillars by performing an angled implant to each of the plurality of pillars. The angled implant may be delivered at a non-zero angle of inclination relative to a perpendicular extending from a top surface of the base layer. The method may further include etching the device structure to remove the capping layer from along a lower section of each of the plurality of pillars, wherein the capping layer remains along the upper section of each of the plurality of pillars.

In another aspect, a method of forming a vertical field-effect-transistor (vFET) may include providing a device structure including a plurality of pillars extending above an oxide layer, forming a capping layer over the plurality of pillars and the oxide layer, and forming a drain in the plurality of pillars by performing an angled implant to just an upper section of each of each of the plurality of pillars, wherein the angled implant is delivered at a non-zero angle of inclination relative to a perpendicular extending from a top surface of the oxide layer. The method may further include removing the capping layer from along a lower section of each of the plurality of pillars, wherein the capping layer remains along the drain of each of the plurality of pillars.

In yet another aspect, a method of forming a vertical field-effect-transistor (vFET) may include providing a plurality of pillars extending above an oxide layer and a source layer, forming a capping layer over the plurality of pillars and the oxide layer, and performing an angled ion implant to just an upper section of each of each of the plurality of pillars to form a drain in each of the plurality of pillars by. The angled ion implant may be delivered at a non-zero angle of inclination relative to a perpendicular extending from a top surface of the oxide layer, wherein the angled ion implant modifies the capping layer along the drain of each of the plurality of pillars. The method may further include etching the capping layer to removing the capping layer from along a lower section of each of the plurality of pillars, wherein the capping layer remains along the drain of each of the plurality of pillars.

BRIEF DESCRIPTION OF THE DRAWINGS

The accompanying drawings illustrate exemplary approaches of the disclosure, including the practical application of the principles thereof, as follows.

Figure 1:
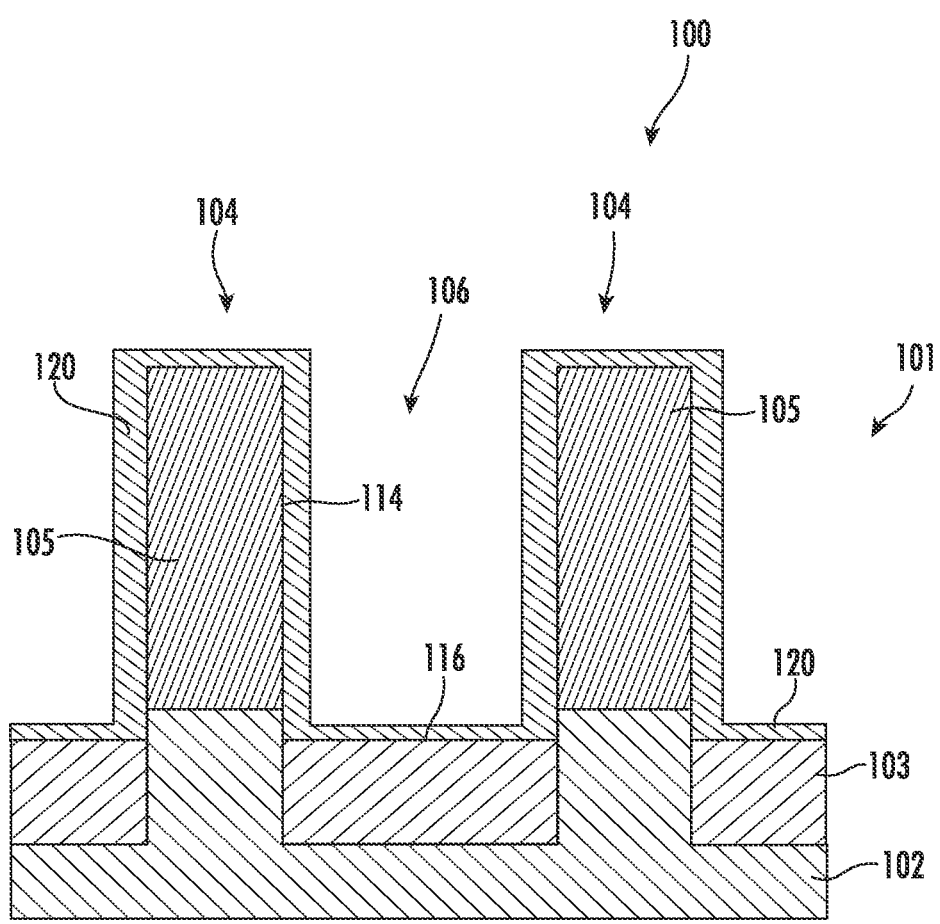
FIG. 1 is a side cross-sectional view of a device according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein provide an integration scheme including an angled ion implant, which both dopes a drain of a VFET and creates a hardened spacer along an upper section of each pillar/fin of the VFET. In some embodiments, a high-temperature Thermion implant is used to modify the composition and thus the etch rate of the deposited capping layer(s) during, e.g., a dilute hydrofluoric acid (HDF) etch process. During the angled ion implant, a lower portion of the sidewall of each pillar/fin is shadowed by the nearest neighboring pillar/fin. Unimplanted portions of the capping layer are removed by the wet etch.

FIG. 1 is a side cross-sectional view of a semiconductor device structure (hereinafter "device") 100, such as a vertical field-effect-transistor (vFET), according to one or more embodiments described herein. The device 100 may include a device structure 101 having a base layer 102 and an oxide layer 103 formed over the base layer 102. In some embodiments, the base layer 102 is a source layer (e.g., $P^+$) and the oxide layer 103 is a shallow trench isolation (STI) layer. The device structure 101 may further include a plurality of pillars 104, or fins, extending above the base layer 102 and the oxide layer 103. In some embodiments, the pillars 104 may be formed by etching a series of trenches 106 into a $N^-$ layer 105 of the device structure 101. The trenches 106 may be defined, in part, by a sidewall 114 and a bottom surface 116 of the device structure 101.

As further shown, a capping layer 120 may be formed over the device structure 101, including directly over the pillars 104 and over the oxide layer 103. Although non-limiting, the capping layer 120 may be silicon nitride (SiN) conformally deposited over the device structure 101.

Figure 2:
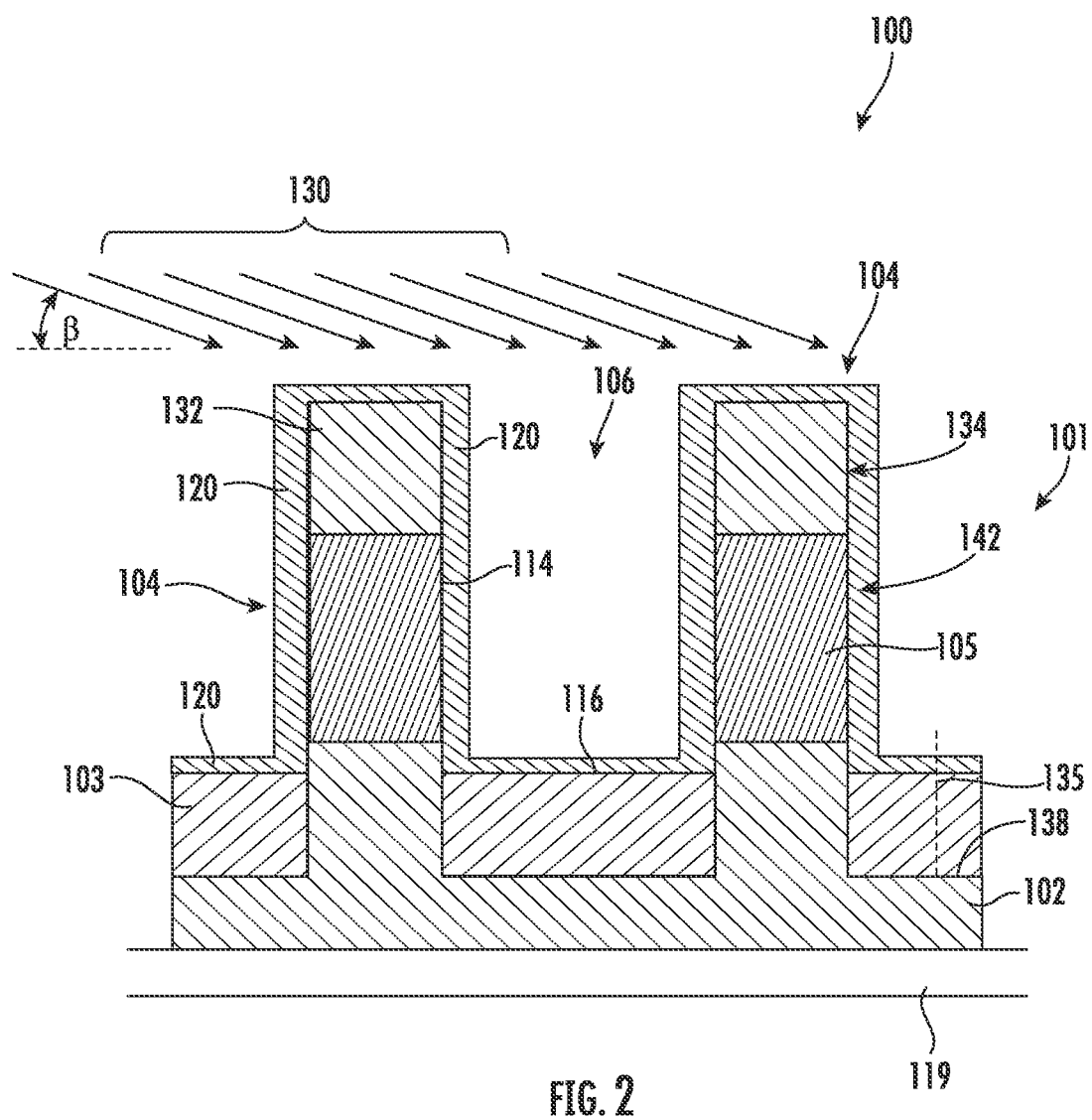
FIG. 2 is a side cross-sectional view illustrating the device during an ion implant, according to embodiments of the present disclosure.

Next, as shown in FIG. 2, an ion implant 130 may be performed to the device structure 101 to form a drain 132 in an upper section 134 of each of the pillars 104. In some embodiments, the drains 132 may be doped by delivering ions (e.g., boron or phosphorous) to the pillars 104 at a non-zero angle of inclination β relative to a perpendicular 135 extending from a top surface 138 of the base layer 102. The angle of inclination β may be selected so the ion implant 130 does not impact a lower portion 142 of the pillars 104. The angle of inclination β may vary in other embodiments so the ion implant 130 impacts more or less of the sidewall 114. Still furthermore, the device structure 101 may be rotated during or between successive implants so each sidewall 114 of the pillars 104 is impacted. For example, the device structure 101 may be rotated between each implant process by 45°, 90°, 180°, etc.

In some embodiments, the ion implant 130 may be a high-temperature implant capable of simultaneously forming the drain 132 in the pillars 104 and modifying properties of the capping layer 120 along the drain 132. More specifically, the ion implant 130 may remove or liberate hydrogen of the SiN capping layer 120 to harden the capping layer 120 along the upper section 134 of the pillars 104. In one non-limiting example, the silicon nitride is implanted with a 1 keV Carbon 1e16 implant at 350° C. and at an angle (β) of approximately 75°. In other embodiments, the ion implant 130 may be performed while a platen 119 supporting the pillars 104 is at a temperature greater than 500° C.

Figure 3:
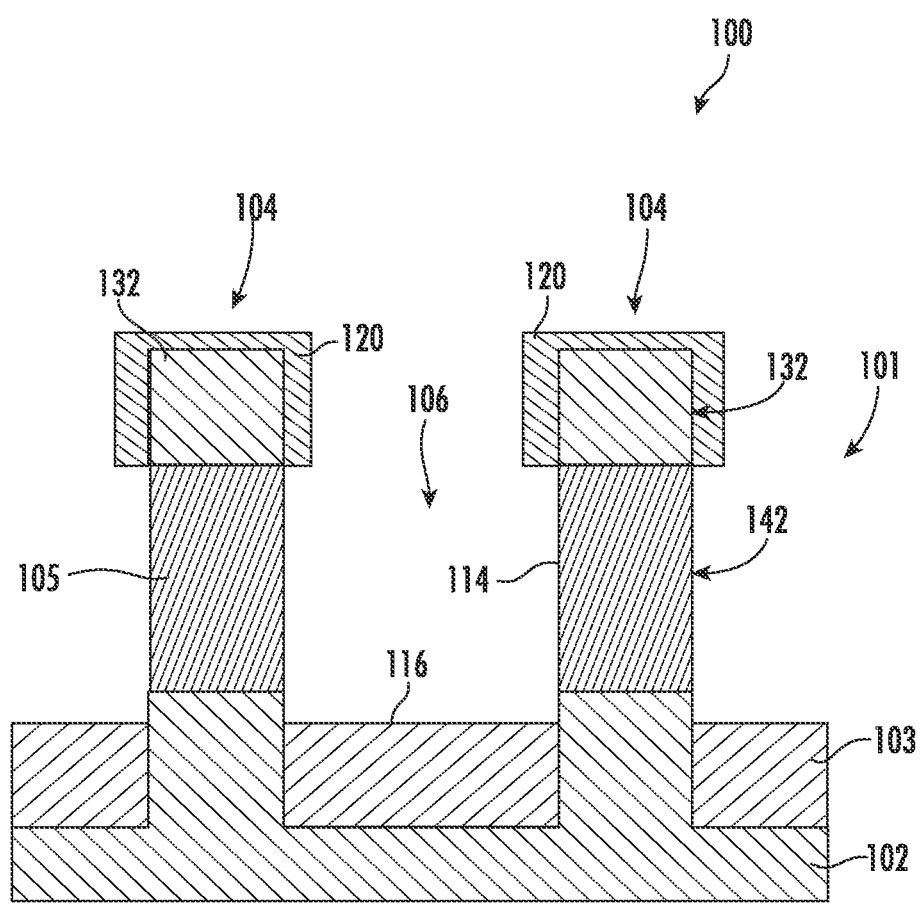
FIG. 3 is a side cross-sectional view illustrating the device following an etch process, according to embodiments of the present disclosure.

As shown in FIG. 3, an etch process may be performed on the device structure 101 to remove the capping layer 120 from the lower portion 142 of the sidewall 114 of the pillars 104. More specifically, in some embodiments, the etch process is a wet etch (e.g., HDF) operable to remove the capping layer 120 from along the $N^-$ layer 105 and from atop the oxide layer 103. As shown, the capping layer 120 may remain along the upper section 134 of the pillars 104 due to the increased etch resistance caused by the ion implant 130.

Figure 4:
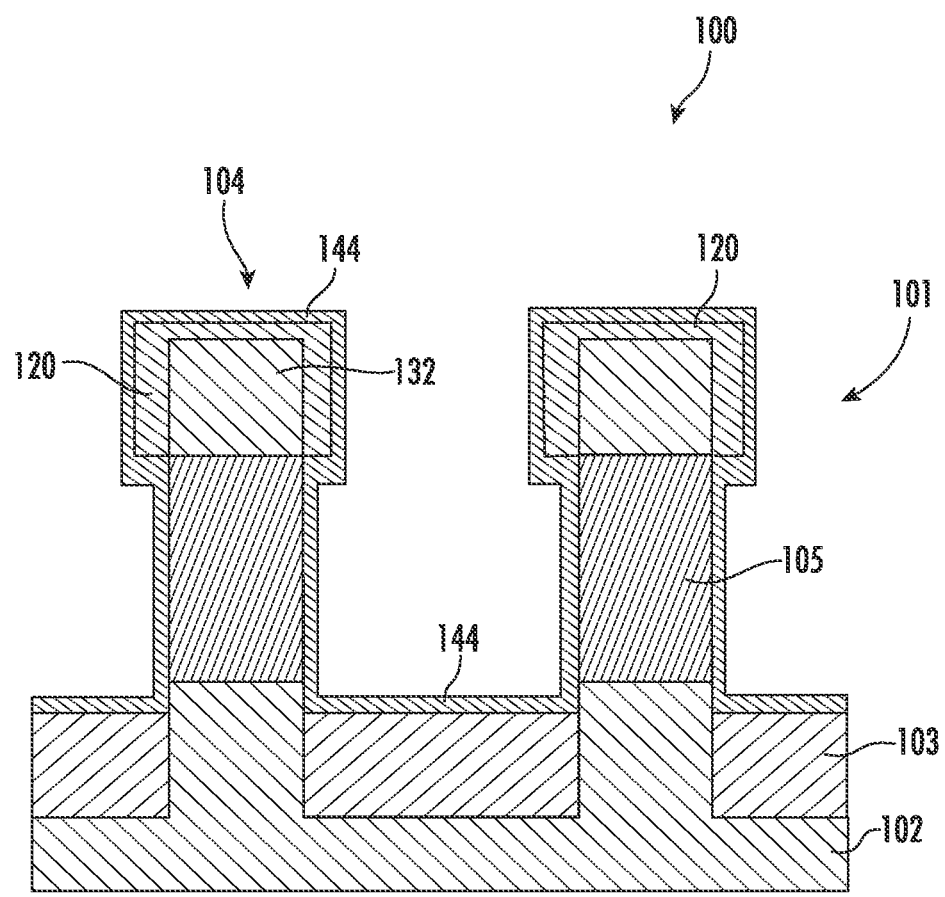
FIG. 4 is a side cross-sectional view illustrating the device following formation of a dielectric layer, according to embodiments of the present disclosure.

As shown in FIG. 4, a dielectric layer 144 may be formed over the device structure 101, including directly atop/along the capping layer 120, the $N^-$ layer 105, and the oxide layer 103. In some embodiments, the dielectric layer 144 may be a high-k dielectric layer conformally deposited over the device structure 101.

Figure 5:
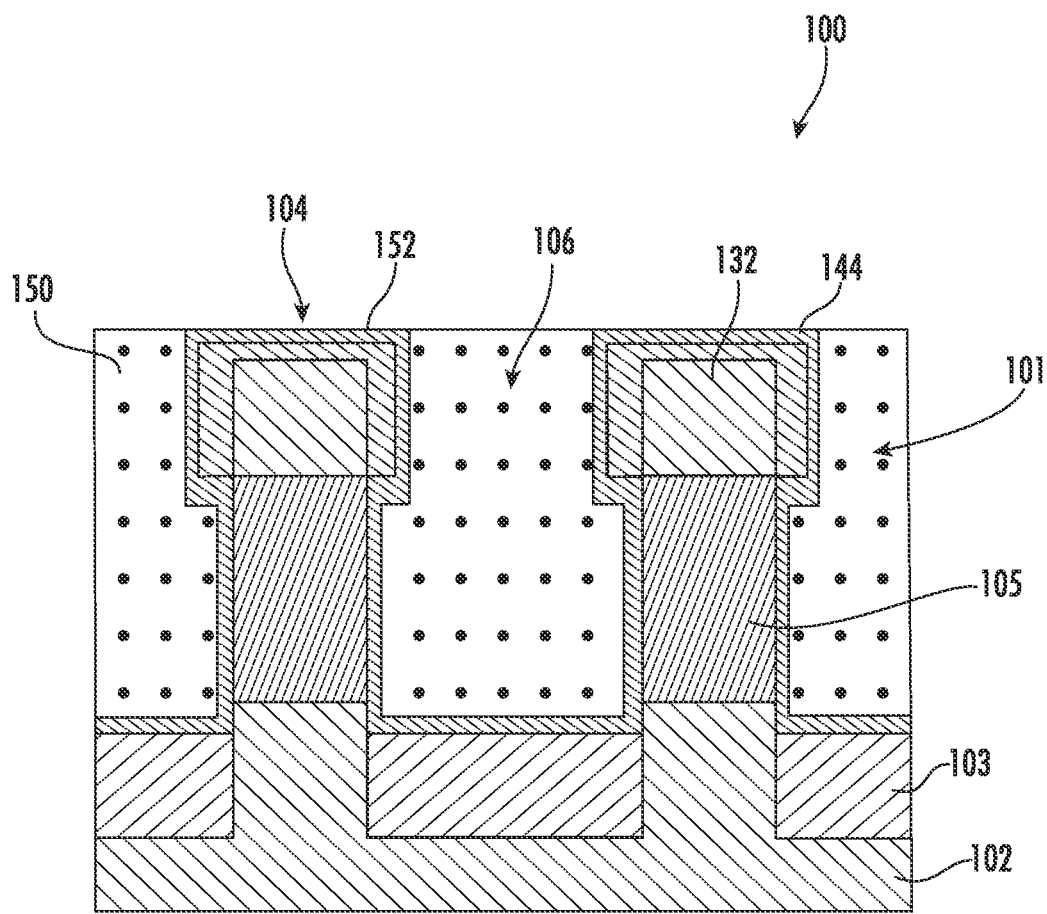
FIGS. 5-6 are side cross-sectional views illustrating the device following formation of a gate material, according to embodiments of the present disclosure.
Figure 6:
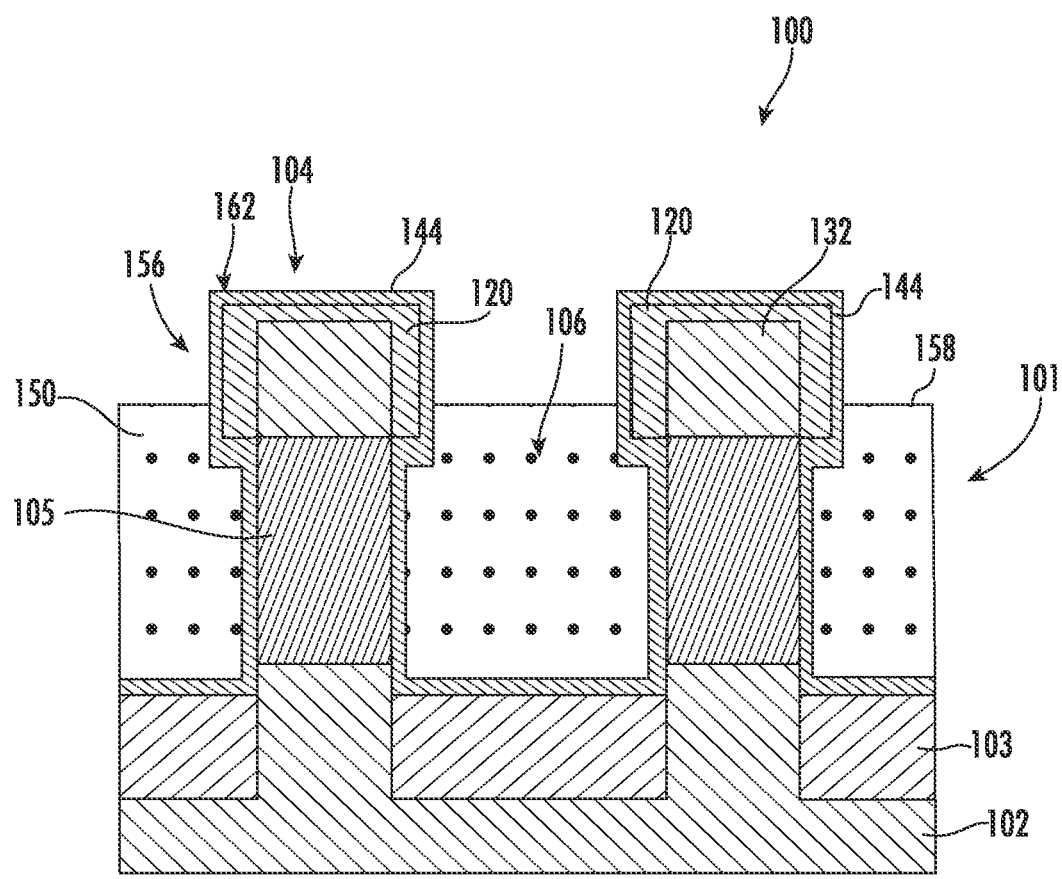

As shown in FIG. 5, a gate material 150 may then be formed over the device structure 101 including within the trenches 106. In some embodiments, the gate material 150 may be a metal deposited over the device 100 and then planarized (e.g., via CMP) or etched back selective to a top surface 152 of the dielectric layer 144. The gate material 150 may then be recessed, as shown in FIG. 6. In some embodiments, the gate material 150 is etched to a level above the $N^-$ layer 105 of the pillars 104. The capping layer 120 and an exposed portion 162 of the dielectric layer 144 remain above a top surface 158 of the gate material 150 after the gate material 150 is recessed.

Figure 7:
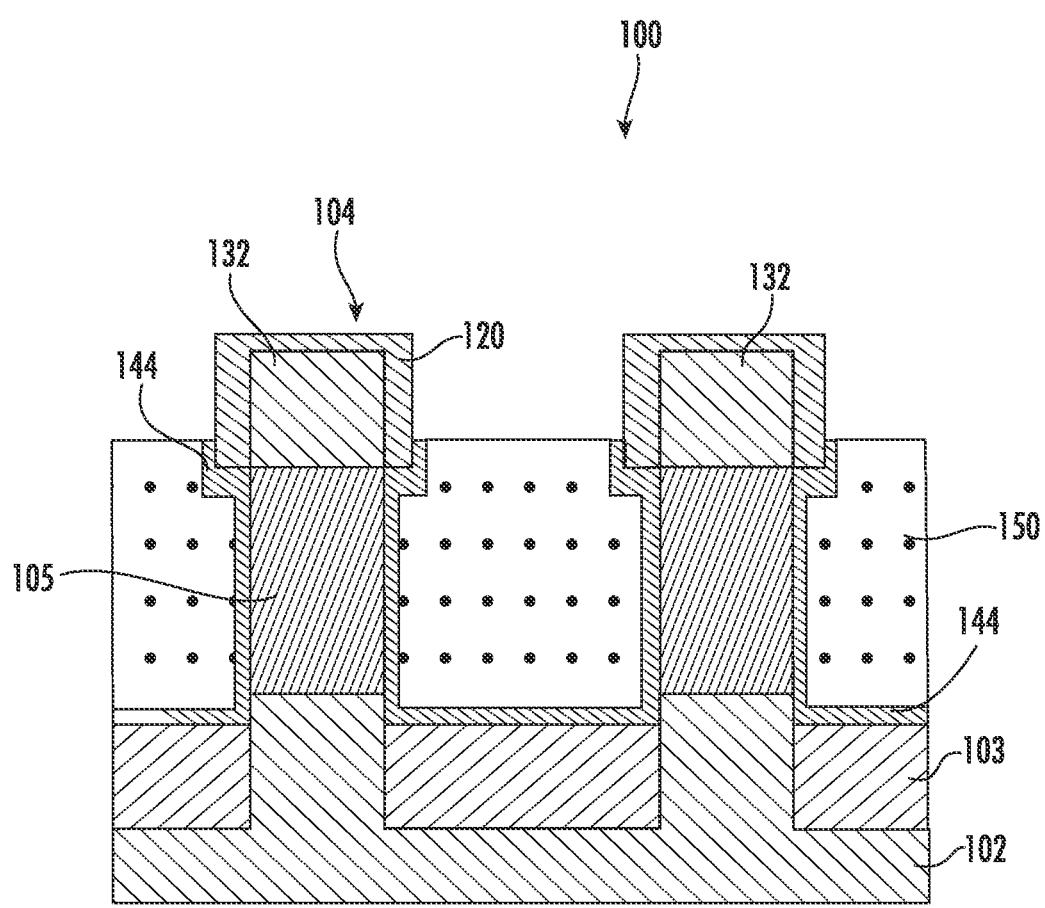
FIG. 7 is a side cross-sectional view illustrating the device following removal of a portion of the dielectric layer, according to embodiments of the present disclosure.

Next, as demonstrated in FIG. 7, the exposed portion 162 of the dielectric layer 144 is removed (e.g., etched) to expose the capping layer 120 along the drains 132. In some embodiments, the dielectric layer 144 is removed selective to the top surface 158. Advantageously, the remaining capping layer 120 forms a spacer between the gate and drain 132 to reduce gate-to-drain parasitic capacitance. Furthermore, the drains 132 are self-aligned to the remaining capping layer 120.

Figure 8:
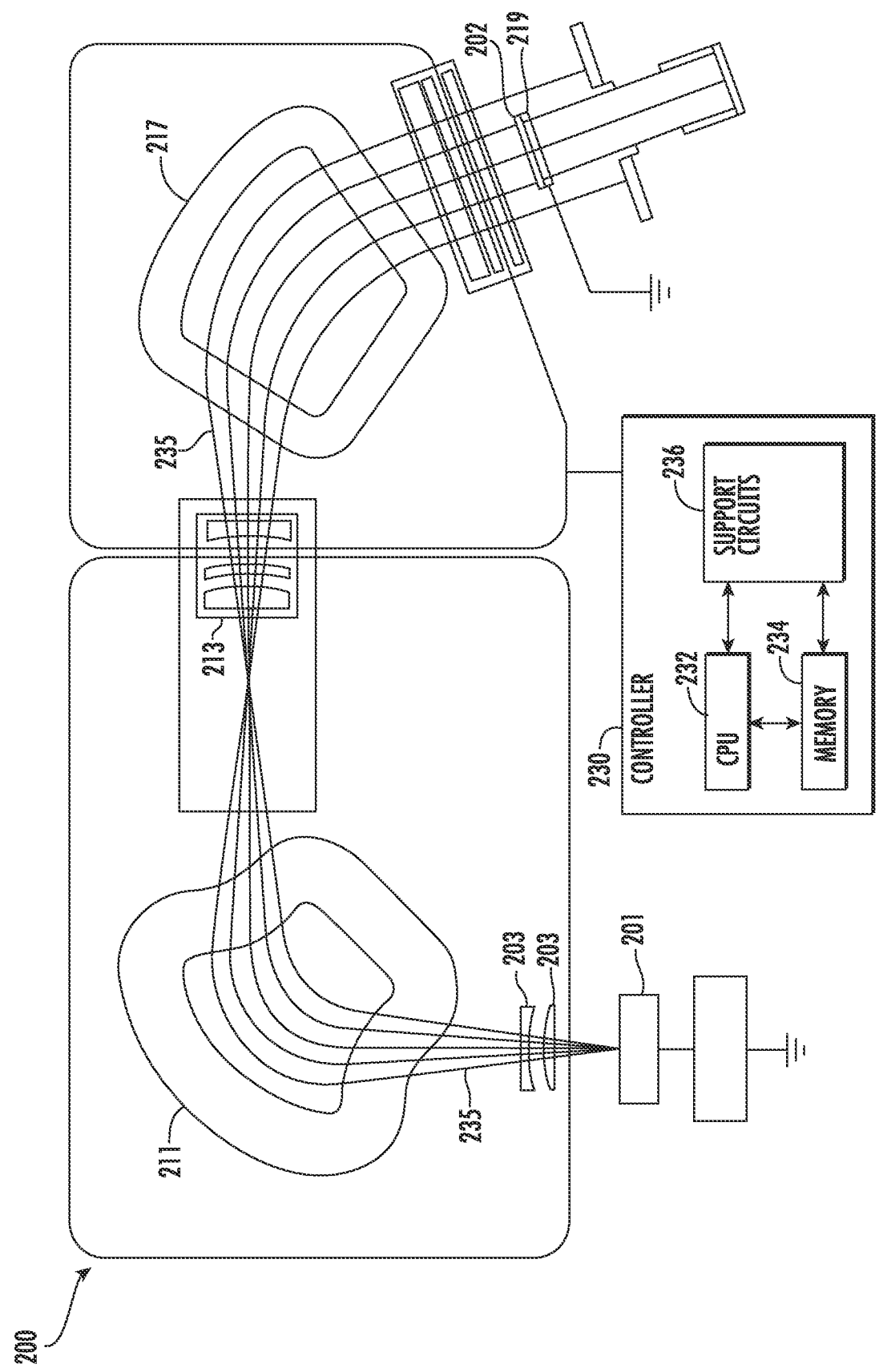
FIG. 8 illustrates a schematic diagram of a processing apparatus according to embodiments of the present disclosure.

FIG. 8 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the high-temperature angled ion implant 130 demonstrated in FIG. 2 for forming the drains 132 and modifying properties of the capping layer 120. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the device structure 101 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device structure including a plurality of pillars extending from a base layer;
   forming a capping layer over the device structure;
   forming a drain in an upper section of each of the plurality of pillars by performing an angled implant to each of the plurality of pillars, wherein the angled implant is delivered into the capping layer at a non-zero angle of inclination relative to a perpendicular extending from a top surface of the base layer; and
   etching the device structure to remove the capping layer from along a lower section of each of the plurality of pillars, wherein the capping layer remains along the upper section of each of the plurality of pillars.

2. The method of claim 1, further comprising:
   forming a dielectric layer over the device structure;
   forming a gate material over the dielectric layer;
   recessing the gate material; and
   removing an exposed portion of the dielectric layer.

3. The method of claim 2, further comprising forming an oxide layer atop the base layer.

4. The method of claim 3, wherein the dielectric layer is a high-k dielectric layer formed over the plurality of pillars and over the oxide layer.

5. The method of claim 1, wherein the angled implant is a high-temperature ion implant performed at a temperature greater than 300° C.

6. The method of claim 1, wherein the angled implant is a high-temperature ion implant performed at a temperature greater than 500° C.

7. The method of claim 1, wherein forming the capping layer comprises conformally depositing a silicon nitride layer along the plurality of pillars, and wherein etching the device structure comprises etching the silicon nitride layer using a dilute hydrofluoric acid.

8. The method of claim 1, further comprising etching the device structure to form the plurality of pillars, wherein each of the plurality of pillars is an N-layer, and wherein the base layer is a P+ source layer.

9. A method of forming a vertical field-effect-transistor (vFET), comprising:
   providing a device structure including a plurality of pillars extending above an oxide layer;
   forming a capping layer over the plurality of pillars and the oxide layer;
   forming a drain in the plurality of pillars by performing an angled ion implant to just an upper section of each of the plurality of pillars, wherein the angled ion implant is delivered into the capping layer at a non-zero angle of inclination relative to a perpendicular extending from a top surface of the oxide layer; and
   removing the capping layer from along a lower section of each of the plurality of pillars, wherein the capping layer remains along the drain of each of the plurality of pillars.

10. The method of claim 9, further comprising:
    forming a dielectric layer over the plurality of pillars and the oxide layer;
    forming a gate material over the dielectric layer;
    recessing the gate material; and
    removing an exposed portion of the dielectric layer from atop the capping layer.

11. The method of claim 9, wherein the angled ion implant is a high-temperature ion implant performed at a temperature greater than 300° C.

12. The method of claim 9, wherein the angled ion implant is a high-temperature ion implant performed at a temperature greater than 500° C.

13. The method of claim 9, wherein forming the capping layer comprises conformally depositing a silicon nitride layer along the plurality of pillars, and wherein removing the capping layer comprises etching the silicon nitride layer using a dilute hydrofluoric acid.

14. A method of forming a vertical field-effect-transistor (vFET), comprising:
    providing a plurality of pillars extending above an oxide layer and a source layer;
    forming a capping layer over the plurality of pillars and the oxide layer;
    performing an angled ion implant to just an upper section of each of the plurality of pillars to form a drain in each of the plurality of pillars by, wherein the angled ion implant is delivered into the capping layer at a non-zero angle of inclination relative to a perpendicular extending from a top surface of the oxide layer, and wherein the angled ion implant decreases an etch rate of the capping layer along the drain of each of the plurality of pillars; and
    etching the capping layer to remove the capping layer from along a lower section of each of the plurality of pillars, wherein the capping layer remains along the drain of each of the plurality of pillars.

15. The method of claim 14, further comprising:
    forming a dielectric layer over the plurality of pillars and the oxide layer;
    forming a gate material over the dielectric layer;
    recessing the gate material; and
    removing an exposed portion of the dielectric layer from atop the capping layer.

16. The method of claim 14, wherein performing the angled ion implant comprises delivering boron ions to the plurality of pillars while a platen supporting the plurality of pillars is at a temperature greater than 350° C.

17. The method of claim 14, wherein etching the capping layer comprises removing the capping layer using a dilute hydrofluoric acid.

18. The method of claim 14, further comprising preventing the angled ion implant from impacting the lower section of each of the plurality of pillars.

\* \* \* \* \*